(12) United States Patent
Benjamin

(10) Patent No.: US 7,345,915 B2
(45) Date of Patent: Mar. 18, 2008

(54) MODIFIED-LAYER EPROM CELL

(75) Inventor: Trudy Benjamin, Portland, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/263,337

(22) Filed: Oct. 31, 2005

(65) Prior Publication Data

US 2007/0097745 A1    May 3, 2007

(51) Int. Cl.
*G11C 16/04*    (2006.01)
(52) U.S. Cl. .............................. 365/185.14; 365/185.26
(58) Field of Classification Search ........... 365/185.14, 365/185.26, 185.33
See application file for complete search history.

(56) References Cited

U.S. PATENT DOCUMENTS

| | | | |
|---|---|---|---|
| 5,015,885 A | 5/1991 | El Gamal et al. | |
| 5,057,447 A | 10/1991 | Paterson | |
| 5,289,210 A | 2/1994 | Takayanagi | |
| 5,371,698 A | 12/1994 | Koehler | |
| 5,594,366 A | 1/1997 | Khong et al. | |
| 5,625,211 A | 4/1997 | Kowshik | |
| 5,716,874 A | 2/1998 | Ko et al. | |
| 5,773,862 A | 6/1998 | Peng et al. | |
| 5,856,688 A * | 1/1999 | Lee et al. ................... | 257/295 |
| 5,880,991 A | 3/1999 | Hsu et al. | |
| 5,931,335 A | 8/1999 | Cippitani | |
| 6,113,208 A | 9/2000 | Benjamin et al. | |
| 6,255,164 B1 | 7/2001 | Liu et al. | |
| 6,325,483 B1 | 12/2001 | Harbour et al. | |
| 6,439,697 B1 | 8/2002 | Axtell et al. | |
| 6,528,842 B1 | 3/2003 | Luich et al. | |
| 6,543,882 B2 | 4/2003 | Axtell et al. | |
| 6,653,183 B2 | 11/2003 | Hung | |
| 6,769,757 B2 | 8/2004 | Skene et al. | |
| 6,794,908 B2 | 9/2004 | Erstad | |
| 6,882,573 B2 * | 4/2005 | Blanchard ............... | 365/185.23 |
| 2002/0060722 A1 | 5/2002 | Axtell et al. | |
| 2004/0036106 A1 | 2/2004 | Rudect | |
| 2004/0084712 A1 | 5/2004 | Lin et al. | |
| 2004/0223034 A1 | 11/2004 | Feinn et al. | |
| 2005/0189586 A1* | 9/2005 | Blanchard ................... | 257/335 |
| 2005/0231536 A1 | 10/2005 | Benjamin et al. | |

(Continued)

FOREIGN PATENT DOCUMENTS

| | | |
|---|---|---|
| DE | 10141962 | 3/2003 |
| EP | 1081638 | 3/2001 |

OTHER PUBLICATIONS

William D. Brown. et al., "Floating Gate Planar Devices in Non-volatile Semiconductor Memory Technology", 1998, pp. 102-105, IEEE Press, Piscataway, N.J.
U.S.P.T.O. Office Action for U.S. Appl. No. 11/360,801, mailed Jan. 12, 2007 (27pp.).
Response dated Apr. 10. 2007, U.S. Appl. No. 11/360,801 (17pp.).

(Continued)

*Primary Examiner*—Vu A. Le

(57) ABSTRACT

An EPROM cell includes a semiconductor substrate, having source and drain regions, a floating gate, including a semiconductive polysilicon layer electrically interconnected with a first metal layer, and a control gate, including a second metal layer. The floating gate is disposed adjacent to the source and drain regions and separated from the semiconductor substrate by a first dielectric layer, and the second metal layer of the control gate is capacitively coupled to the first metal layer with a second dielectric layer therebetween.

25 Claims, 3 Drawing Sheets

U.S. PATENT DOCUMENTS

| | | |
|---|---|---|
| 2005/0231541 A1 | 10/2005 | Benjamin et al. |
| 2005/0231545 A1 | 10/2005 | Benjamin et al. |
| 2005/0231562 A1 | 10/2005 | Torgerson et al. |
| 2006/0003528 A1 | 1/2006 | Forbes |

OTHER PUBLICATIONS

U.S.P.T.O. Office Action for U.S. Appl. No. 11/360,801, mailed Jul. 11, 2007.

Response dated Oct. 2, 2007. U.S. Appl. No. 11/360,801 (23pp.).

* cited by examiner

MODIFIED-LAYER EPROM CELL

BACKGROUND

Programmable read-only memory (PROM) chips are well known and widely used in a variety of computer devices. A conventional PROM chip includes a grid of metal conductors forming columns and rows. The columns and rows are formed on different layers of the chip, separated by a dielectric layer, and initially include conductive fuses interconnecting each row/column intersection. Each intersection provides one bit. To program the chip, a relatively high current is selectively routed to certain fuses to cause them to burn out. Intersections where fuses remain have a value of 1, while those where the fuses have been burned out provide a value of 0 in the binary logic of the circuit.

Modified types of PROM chips are also known. Negative-channel metal-oxide semiconductor (NMOS) chips have been developed that allow bits to be addressed individually, rather than in an array, and use different fuse technology. Such non-standard PROM chips are used in ink jet printheads and the like. Notwithstanding differences with standard PROM technology, NMOS chips are programmed and used in basically the same way. Fuses are selectively burned out to program each bit to the desired binary state.

Programming and using ROM chips in this way has some drawbacks. If a chip is improperly programmed initially, there is no way to fix it, and the chip must be discarded. Additionally, fuses are relatively large, and can be unreliable. In ink jet printhead circuits, for example, fuses can damage the ink jet orifice layer during programming, and after a fuse burns out, metal debris from the fuse can be drawn into the ink and cause blockage in a pen, or result in poor quality printing.

In recent years, electronically programmable read-only memory (EPROM) devices have also been developed. Unlike typical PROM chips, EPROM chips do not include fuses. Like typical ROM chips, EPROMs include a conductive grid of columns and rows. The cell at each intersection has two gates that are separated from each other by a thin oxide layer that acts as a dielectric. One of the gates is called a floating gate and the other is called a control gate or input gate. The floating gate's only link to the row is through the control gate. A blank EPROM has all of the gates fully open, giving each cell a value of 1. That is, the floating gate initially has no charge, which causes the threshold voltage to be low.

To change the value of the bit to 0, a programming voltage (e.g. 10 to 16 volts) is applied to the control gate and drain. This programming voltage draws excited electrons to the floating gate, thereby increasing the threshold voltage. The excited electrons are pushed through and trapped on the other side of the thin oxide layer, giving it a negative charge. These negatively charged electrons act as a barrier between the control gate and the floating gate. During use of the EPROM cell, a cell sensor monitors the threshold voltage of the cell. If the threshold voltage is low (below the threshold level), the cell has a value of 1. If the threshold voltage is high (above the threshold level), the cell has a value of zero.

Because EPROM cells have two gates at each intersection, an EPROM chip requires additional layers compared to a standard NMOS or PROM chip. Consequently, while some of the drawbacks of fuses in NMOS circuits could be eliminated by the application of EPROM circuitry to the same application, the use of EPROM cells either requires that the chip be provided with additional layers, which increases the cost and complexity of the chip, or that a separate EPROM chip be provided.

BRIEF DESCRIPTION OF THE DRAWINGS

Various features and advantages of the invention will be apparent from the detailed description which follows, taken in conjunction with the accompanying drawings, which together illustrate, by way of example, features of the invention, and wherein.

DETAILED DESCRIPTION

Figure 1A:
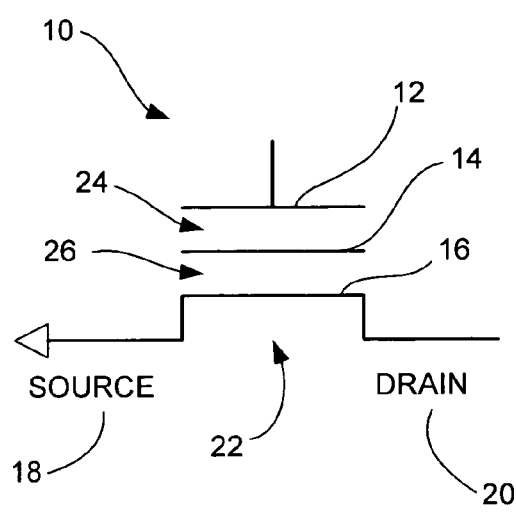
FIG. 1A is a schematic diagram of a typical EPROM transistor.

Reference will now be made to exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the invention as illustrated herein, which would occur to one skilled in the relevant art and having possession of this disclosure, are to be considered within the scope of the invention.

The inventor has recognized that electronically programmable read-only memory, or EPROM, can be used to eliminate fuses in NMOS circuits, such as in ink jet printheads and other applications. EPROM cells do not include fuses, and provide a number of advantages over NMOS bits.

Figure 1B:
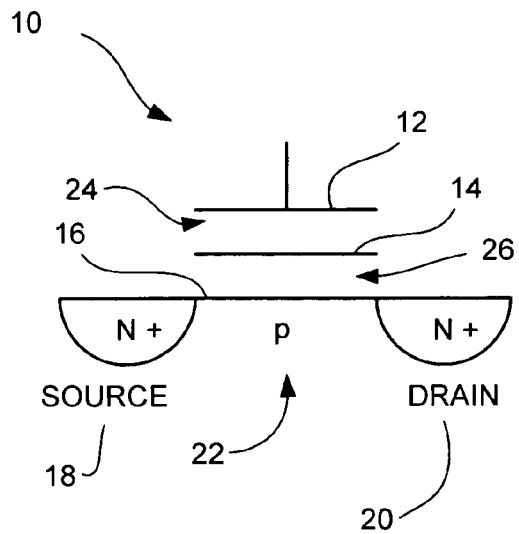
FIG. 1B is an alternative schematic diagram of a typical EPROM transistor.

Two different schematic diagrams of an EPROM cell or bit 10 are shown in FIGS. 1A and 1B. An EPROM cell generally includes an input gate 12 (also called a control gate), a floating gate 14, and a semiconductor substrate 16 that includes a source 18 and a drain 20. As shown in FIG. 1B, the substrate is provided with N+ doped regions adjacent to the source and drain, respectively, and a p doped region 22 therebetween. The control gate and floating gate are capacitively coupled together, with a dielectric material 24 between them, such that the control gate voltage is coupled to the floating gate. Another layer of dielectric material 26 is also disposed between the floating gate 14 and the semiconductor substrate 16.

A high voltage bias on the drain 20 generates energetic "hot" electrons. A positive voltage bias between the control gate 12 and the drain pulls some of these hot electrons onto the floating gate 14. As electrons are pulled onto the floating gate, the threshold voltage of the cell, that is, the voltage required to cause the gate/drain to conduct current, increases. If sufficient electrons are pulled onto the floating gate, those electrons will block current flow such that the threshold voltage will eventually increase to a level above a desired threshold voltage (e.g. the operating voltage of the circuit). This will cause the cell to block current at that voltage level, which changes the operating state of the cell from a 1 to a zero. After programming of the cell, a cell sensor (not shown) is used during normal operation to detect the state of the EPROM cell.

Figure 2:
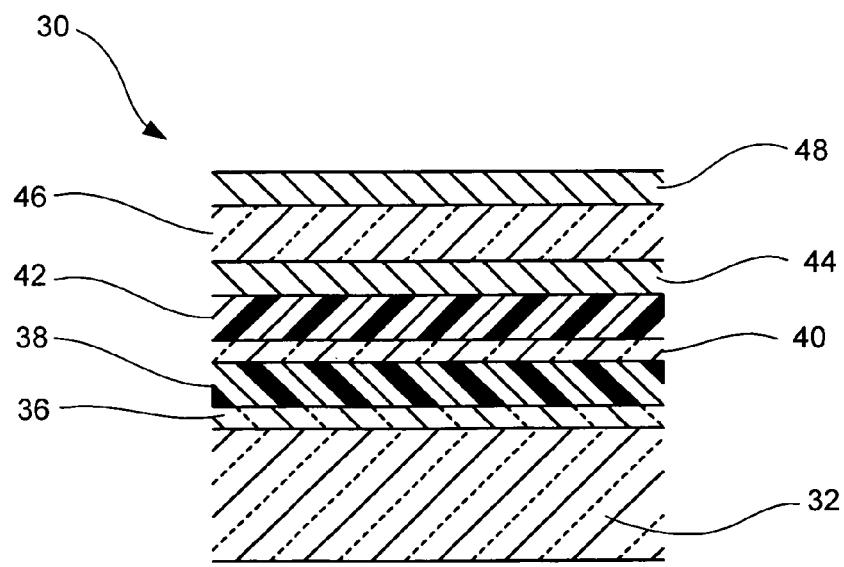
FIG. 2 is a cross-sectional view showing the circuitry layers in a typical EPROM chip.

Because EPROM cells include two gates at each bit location, these chips require more layers than a PROM or NMOS chip. Shown in FIG. 2 is a cross-sectional view of the layers in a typical EPROM chip 30. Disposed atop the semiconducting silicon substrate 32 is a gate oxide 36. Disposed atop the gate oxide layer is a layer of polysilicon material 38, in which the floating gate (14 in FIG. 1) is formed. When properly doped, this polysilicon material functions as a conductor. The gate oxide layer 36 functions as a dielectric layer (26 in FIG. 1) between the floating gate and the semiconductor substrate.

Disposed atop the floating gate layer is another layer 40 of gate oxide material, which provides another dielectric layer, atop which is another layer of polysilicon 42, in which the control gate (12 in FIG. 1) is formed. Disposed atop the control gate layer are one or more metal layers 44, 48, separated by another dielectric layer 46. The metal layers provide row and column lines for the EPROM circuit, and also make the various electrical connections between the control gate, the drain, and other components of the circuit.

Figure 3:
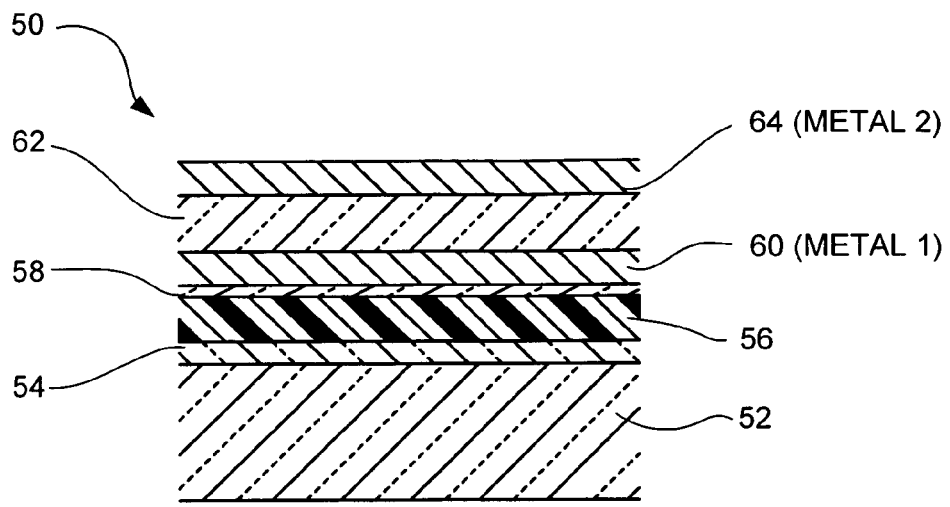
FIG. 3 is a cross-sectional view showing the layers in one embodiment of an ink jet printhead circuit.

These circuit layers in a typical EPROM circuit are in contrast to the layers found in a typical PROM circuit, such as that used in an inkjet printhead. A cross-sectional view of the layers in an inkjet control PROM chip 50 is given in FIG. 3. This chip includes a semiconductor substrate 52, atop which is an oxide layer 54 (such as silicon dioxide, $SiO_2$), followed by a polysilicon layer 56, a dielectric layer 58, then a metal 1 layer 60 and metal 2 layer 64, these metal layers being separated by a dielectric layer 62.

The two metal layers 60, 64 provide the row and column lines for the circuit, and other circuit connections. It will be apparent that this layer configuration lacks an additional polysilicon layer and gate dielectric that would be needed for creation of an EPROM cell. Prior attempts to implement EPROM's in this type of circuit have focused on adding additional process steps to add an extra floating gate and gate dielectric. Another option is to add a separate EPROM chip. Both of these options add complexity and cost.

Figure 4:
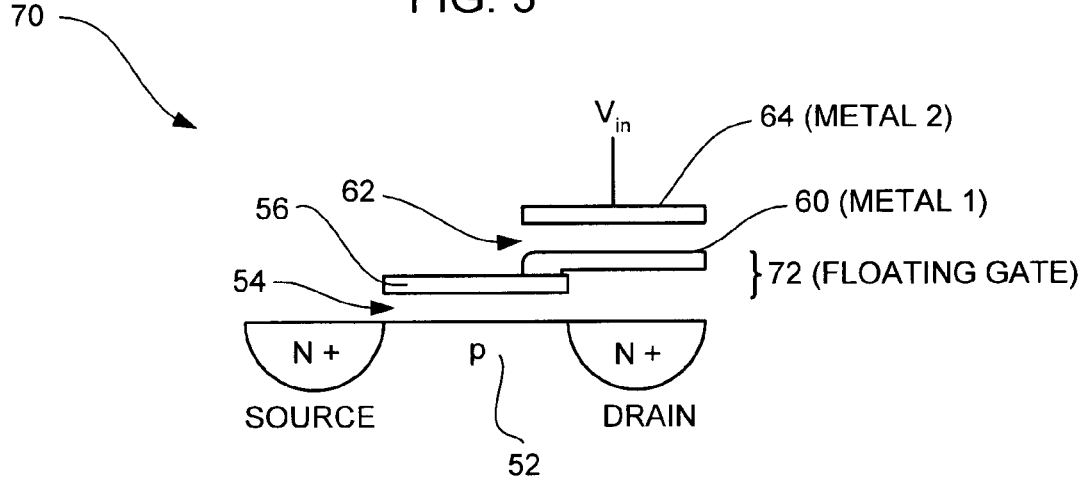
FIG. 4 is a schematic diagram of one embodiment of an EPROM transistor that can be adapted for use with the circuitry layers shown in FIG. 3.

Advantageously, the inventor has developed a structure and method for providing EPROM functionality using the layers in this PROM chip, without adding process layers and cost. Shown in FIG. 4 is a schematic diagram of an EPROM bit 70 that has been designed and fabricated using the existing layers of the inkjet pen control chip shown in FIG. 3. This configuration implements EPROM by creating a capacitive coupling between the metal 1 layer 60 and metal 2 layer 64. Parallel opposing capacitor plates are formed in the metal 1 and metal 2 layers. The plate formed in the metal 2 layer creates a control gate. Because of this configuration, the voltage in this layer will be capacitively coupled to the metal 1 layer.

Another similar parallel structure is formed in the polysilicon layer 56. A break in the dielectric layer 58 below the metal 1 layer is created to allow the metal one layer to be electrically interconnected with this parallel structure in the polysilicon layer. The metal 1 layer and the polysilicon layer thus together create a floating gate 72, which is separated from the silicon substrate by the dielectric layer 54. With this arrangement, the control gate/floating gate structure needed for an EPROM cell is provided.

As used in this description, the term "metal 1" layer always refers to the metal layer that is associated with the floating gate, and the term "metal 2" layer refers to the top metal layer, that associated with the control gate. However, it is to be understood that the terms "first metal layer" and "second metal layer" as used in the claims can be interchanged, depending upon the perspective of the claim. For example, when describing the EPROM cell from the top down (starting from the control gate), the metal layer associated with the control gate (metal 2), will be referred to as the "first metal layer," and the metal layer associated with the floating gate (metal 1) will be referred to as the "second metal layer." Conversely, if the cell is described from the substrate up, the designation of "first metal layer" will correspond to metal 1, and the "second metal layer" will refer to metal 2.

The capacitance between the metal 1 and metal 2 layers can be relatively high. The inventor has used a silicon carbide/silicon nitride material for the dielectric layer 62 that has a moderately high dielectric constant of from about 6 to about 7. Consequently, the capacitance between the metal 1 and metal 2 layers can be in the range of about $1.5 \times 10^{-16}$ $F/\mu m^2$. With a capacitance in this range, the inventor has tested configurations in which the metal 1 and metal 2 capacitor plates each have an area of from about 400 $\mu m^2$ to about 2500 $\mu m^2$ to 400. These tests have shown a total capacitance of from 0.37 pF to 0.6 pF.

Figure 5:
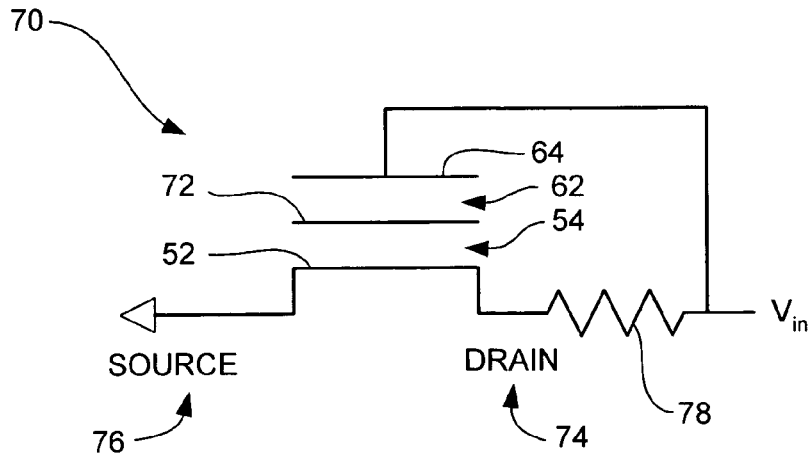
FIG. 5 is a schematic diagram of circuitry for programming the EPROM transistor of FIG. 4.

A schematic diagram of circuitry for programming the EPROM transistor 70 is provided in FIG. 5. Programming of this EPROM cell, like typical EPROM cells, is done by applying a voltage pulse to the control gate 64 and drain 74. This is done in order to provide an adequate quantity of hot electrons to the floating gate 72. It is desirable that the voltage between the source and drain be close to the breakdown voltage of the circuit. The breakdown voltage is the (drain) voltage at which the transistor begins to conduct with the gate below threshold voltage (gate at zero volts). In one embodiment, the inventor has programmed the EPROM circuit at a voltage of about 16±1 V where the circuit has a breakdown voltage of 15 Volts.

In the circuit of FIG. 5, the control gate 64 is tied to the drain 74 with a resistor 78 (having a resistance of, e.g., 100 ohm) in order to limit the breakdown current. Additionally, the physical size of the channel (gate) length—that is, the length of the channel under both gates—can be manipulated to modify the breakdown voltage. For example, a narrower gate length will lower the breakdown voltage. In one embodiment, the inventor has used a gate length of from 3.0 $\mu m$ to 3.5 $\mu m$, instead of 4 $\mu m$ for this purpose.

The time required for programming is a function of the floating gate voltage, the quantity of hot electrons drawn to the floating gate, the threshold voltage change desired, the total gate structure capacitance, and the thickness of the gate oxide (the oxide between the substrate and the floating gate). The gate oxide thickness determines the percentage of energetic hot electrons which are able to reach the floating gate. In one embodiment, the floating gate voltage is in the range of 5 volts to 12 volts, though other voltage ranges can be used. The floating gate voltage depends upon the voltage on the control gate, and the coupling ratio of the metal 1 and metal 2 layers. While the desired hot electrons will be provided with any gate oxide thickness, the thickness of the gate oxide will sometimes be fixed for a given chip configuration. For example, in one embodiment of a printhead control chip, the thickness of the gate oxide is fixed at 700 Å.

The quantity of hot electrons provided during programming is higher when programming is done at close to the breakdown voltage, and with higher current. In one embodiment, the inventor has programmed with a 25 mA current, though other currents can also be used. The inventor has also contemplated a 20 mA programming current, for example, and other currents can also be used. A range for the threshold voltage that the inventor has used is from 3 volts to 7 volts, but other threshold voltage ranges can also be used. Under the above parameters, the inventor has found that a 10 millisecond programming time can be used. However, different programming times can also be used, particularly if the various parameters mentioned above are varied. For example, the programming time can range from less than 100 μs to as much as several seconds (e.g. 4 seconds).

Reading of the EPROM cells is done by detecting the threshold voltage using a cell sensor (not shown) elsewhere in the circuit. Detecting the threshold voltage can be done either by setting the gate/drain voltage and measuring the corresponding current, or by setting the current and measuring the voltage. The inventor has found that the on resistance (Ron) of the EPROM cell changes by a factor of about 2 before and after programming.

The inventor has built and tested this type of EPROM cell in a laboratory setting. In the test setup, a modified cell was built to monitor the floating gate voltage. A voltage pulse was applied to the gate and drain to program the EPROM cell to a desired threshold voltage. To test the cell to sense the gate voltage, the gate of a second sense transistor (not shown) was connected to the floating gate of the EPROM cell. This causes the gate voltage of the sense transistor to be the same as the floating gate voltage. The on resistance (Ron) of the second transistor is proportional to the gate voltage. By monitoring the on resistance of the second transistor, the floating gate voltage could be determined.

Figure 6:
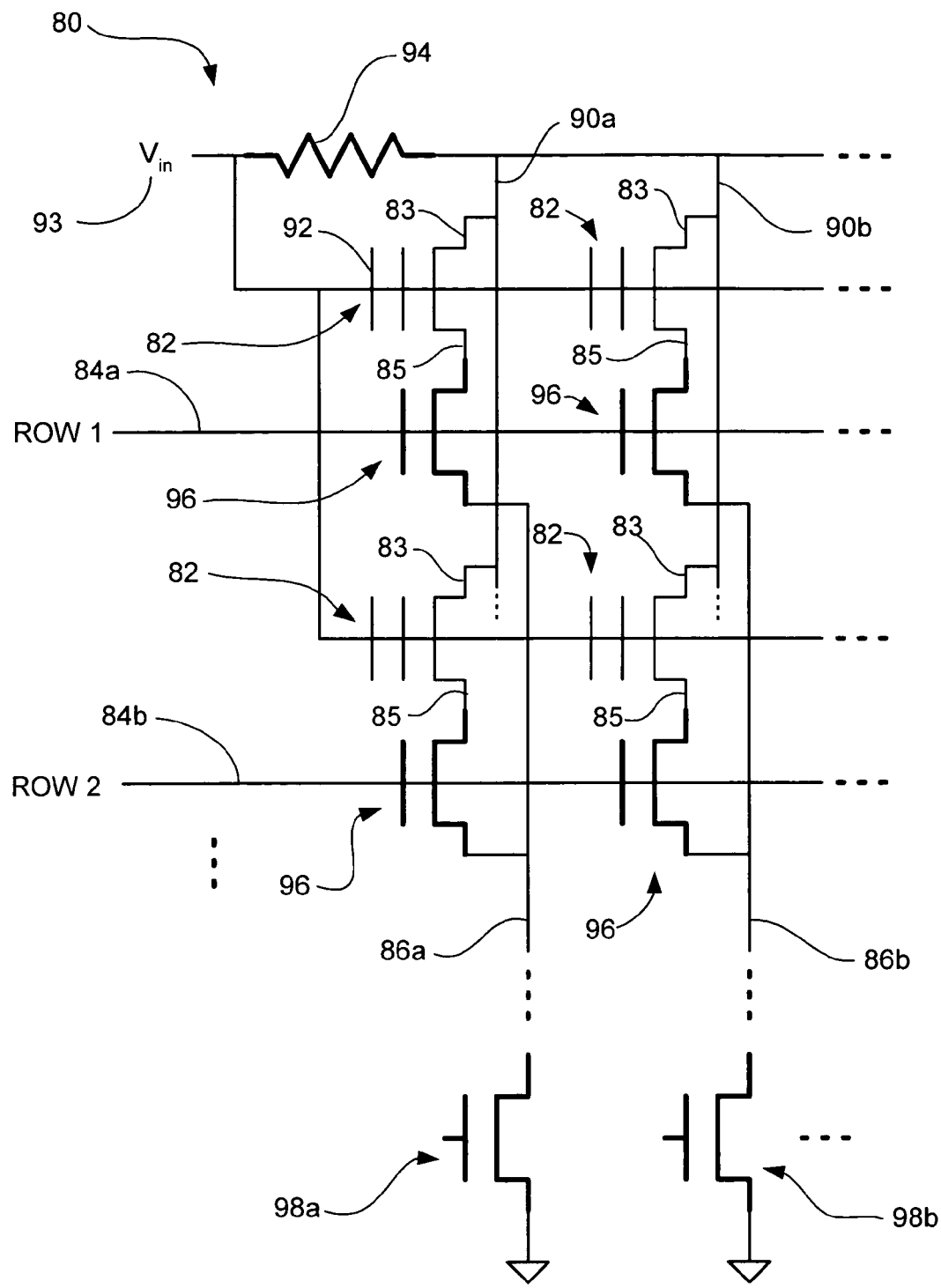
FIG. 6 is a schematic diagram of an EPROM array incorporating an embodiment of a modified-layer EPROM transistor.

Shown in FIG. 6 is a partial schematic diagram of an EPROM array 80 that can be produced using the modified-layer EPROM cell disclosed herein. In this array, EPROM cells 82 are arranged in rows and columns. The gates 92 of the EPROM cells 82 are all tied to the input voltage $V_{in}$ (designated at 93). The drains 83 of the EPROM cells are all tied together through lines 90a, 90b, etc., with a resistor 94 in series to $V_{in}$ to control the current. The sources 85 of the EPROM transistors are tied to the drains of row transistors 96, which are tied through their sources to the drains of column transistors 98a, 98b. The row transistors 96 and column transistors 98 allow selection of the specific EPROM cells, both for programming and reading.

The row lines 84a, 84b connect to the gates of all row select transistors 96 in a given row. The sources of all row transistors 96 in a given column are connected to the drain of the column transistor 98 for that column. The gates of each column transistor 98a 98b are connected to a voltage source (not shown) through column lines (not shown). The sources of the column transistors 98a 98b are connected to a common voltage, such as ground. To program a cell, the cell is selected by applying a voltage to one row line (e.g. 84a) and one column line (e.g. to the gate of column transistor 98a), and then a pulse of relatively high voltage $V_{in}$ (e.g. 16V) is applied. To sense the condition of the cell, a lower input voltage $V_{in}$ pulse (e.g. 5V) is applied in the same way, and the current is monitored. In this array, there is no high voltage across the drain to the source of the EPROM transistor except when programming. Advantageously, there are no drain to gate voltage coupling issues because the drain and gate of the EPROM transistors switch together.

The inventor has found that the size of the row select transistors 96 is significant because they must handle the programming current, such as 20 mA, 25 mA, or higher. For this purpose, the inventor has used row select transistors having a width of 150 μm. It will be apparent that smaller sizes can be used for lower programming current, and larger sizes will be needed for higher current.

In operation, a row signal turns on all row control transistors 96 in that row. A column signal turns on a selected column control transistor 98. An input voltage $V_{in}$ is then applied, and only the cell with both its row and column transistor turned on will have the full voltage across it. All other cells will have the source of the EPROM transistor floating. That is, the source of the EPROM transistor will not be driven to any fixed voltage, but will just float to the voltages on the other terminals. There will be no voltage across the EPROM transistor. Rather than row and column control transistors, it is also possible to provide a single control transistor with each EPROM cell. Such a configuration will provide one control line per cell, with the operation of each EPROM cell being controlled by an individual control transistor. This sort of configuration would have a larger physical size, but would correspond more directly with some control schemes that are currently used for fuses.

The inventor has designed a 2×10 EPROM array in the manner described above for use in providing pen ID bits in an inkjet printhead. In this configuration, the row and column signals can be supplied by the shift register of the circuit. That is, rather than drive the row and column lines individually, the respective values can be shifted into a shift register, and driven from the shift register outputs. The shift register addresses the row and column selects of the 2×10 array. It will be apparent to those skilled in the art of semiconductor design that the geometric configuration of the circuitry can be configured in a variety of ways.

The inventor has built and programmed a 4-bit array based on the above design. After programming, the EPROM cells have held their charge for over a year.

The reliability and longevity of the modified-layer EPROM cell described herein depends upon a number of factors. Because the layers providing the floating gate and gate dielectric structures are of different types and thicknesses than are typically used in EPROM circuits, some aspects of the resultant design affect its robustness. For example, referring to FIGS. 3 and 4 and the materials described above, the control gate 64 and floating gate 72 for this EPROM cell 70 are larger than the corresponding structure in a conventional EPROM circuit. This is, in part, because of the relatively high dielectric thickness of the dielectric layer 62 separating the control gate and floating gate. Leakage between layers is more likely with larger gate structures, and can affect the longevity of the charge on the floating gate.

Additionally, the flatness of the layers can affect their performance. Slight undulations in layer surfaces and variations in the thickness of the different layers can cause charge concentrations and leakage between the layers. In a pen control circuit configured with the layers of the PROM chip shown in FIG. 3, for example, the thickness and flatness of the polysilicon layer 56 and adjacent dielectric layers 54, 58, are not as critical for operation of the PROM circuit. This factor affects the level of quality control applied to formation of these layers. However, in an EPROM circuit, these factors have a greater effect.

Nevertheless, where a lower level of reliability can be tolerated, this configuration can be useful without the need to increase quality control. This is true of inkjet pens. The design life for an inkjet pen is usually about 18 months, primarily because inkjet cartridges are usually sold soon after manufacture, and because the pen then gets used up. Consequently, if the EPROM cells can reliably hold their charge for that time period, there is little likelihood that the device will not work as intended. However, this same structure can be effectively used in other applications where greater reliability is desired by exerting greater control over the flatness and thickness of the layers.

The EPROM structure disclosed herein can replace fuses in many types of circuits without adding process layers and cost. This configuration provides cells that are larger than traditional EPROM cells, but smaller than fuses. EPROM cells configured this way can also be used for other purposes. Because the charge on the floating gate is cumulative, this configuration can be used to store cumulative quantities. For example, in an inkjet printhead, EPROM cells can be successively reprogrammed to track the number of pages printed out, or for other purposes. Since programming of EPROM cells modifies the threshold voltage of the cell, successive programming of these cells can be used to control analog circuits, such as to create a variable time delay. Other applications are also possible.

It is to be understood that the above-referenced arrangements are illustrative of the application of the principles of the present invention. It will be apparent to those of ordinary skill in the art that numerous modifications can be made without departing from the principles and concepts of the invention as set forth in the claims.

What is claimed is:

1. An EPROM cell, comprising:
   a semiconductor substrate, having source and drain regions;
   a floating gate, disposed adjacent to the source and drain regions and separated from the semiconductor substrate by a first dielectric layer of substantially uniform thickness, the floating gate comprising a semiconductive polysilicon layer of substantially uniform thickness engaging the first dielectric layer and being electrically interconnected with a first metal layer; and
   a control gate, comprising a second metal layer, capacitively coupled to the first metal layer via a second dielectric material disposed therebetween.

2. An EPROM cell in accordance with claim 1, wherein the first dielectric material comprises silicon dioxide.

3. An EPROM cell in accordance with claim 1, wherein the second dielectric material comprises silicon carbide/silicon nitride.

4. An EPROM cell in accordance with claim 1, wherein the second dielectric material has a dielectric constant in the range of from about 6 to about 7.

5. An EPROM cell in accordance with claim 1, wherein the first and second metal layers have a capacitance of about $1.5 \times 10^{-16}$ F/µm$^2$.

6. An EPROM cell in accordance with claim 1, wherein the semiconductive polysilicon layer is doped to have a resistance of about 30 ohms per square.

7. An EPROM cell in accordance with claim 1, further comprising a third dielectric layer, disposed between the semiconductive polysilicon layer and the first conductive metal layer, the first conductive metal layer contacting the semiconductive polysilicon layer through a gap formed in the third dielectric layer.

8. An EPROM cell in accordance with claim 1, wherein the floating gate voltage of the cell is in the range of from about 5 volts to about 12 volts.

9. An EPROM cell in accordance with claim 1, wherein the threshold voltage of the cell is in the range of about 3 volts to about 7 volts.

10. An EPROM cell in accordance with claim 1, wherein a programming charge applied to the floating gate is cumulative, such that the cell can be successively charged to store cumulative values.

11. An EPROM cell in accordance with claim 1, wherein the cell is configured to accommodate a programming current of about 25 milliamps.

12. An EPROM cell, comprising:
    a control gate, comprising a first metal layer;
    a second metal layer capacitively coupled to the first metal layer;
    a polysilicon layer, electrically interconnected to the second metal layer, the polysilicon layer and second metal layer comprising a floating gate;
    a doped semiconductor substrate, having source and drain regions;
    a first dielectric layer, disposed between the semiconductor substrate and the polysilicon layer, such that an electrical charge associated with the floating gate will affect a level of current between the source and drain regions; and
    a third dielectric layer, disposed between the semiconductor polysilicon layer and the second conductive metal layer, the second conductive metal layer contacting the semiconductive polysilicon layer through a gap formed in the third dielectric layer.

13. An EPROM cell in accordance with claim 12, further comprising a second dielectric layer disposed between the first metal layer and the second metal layer, the second dielectric layer having a dielectric constant in the range of from about 6 to about 7, and the first and second metal layers having a capacitance of about $1.5 \times 10^{-16}$ F/µm$^2$.

14. An EPROM cell in accordance with claim 12, wherein the first dielectric layer comprises silicon carbide/silicon nitride, and the second dielectric layer comprises silicon dioxide.

15. An EPROM cell in accordance with claim 12, wherein the floating gate voltage of the cell is in the range of from about 5 volts to about 12 volts, the threshold voltage of the cell is in the range of about 3 volts to about 7 volts, and the cell is configured to accommodate a programming current of about 25 milliamps.

16. An EPROM cell in accordance with claim 12, wherein a programming charge applied to the floating gate is cumulative, such that the cell can be successively charged to store cumulative values.

17. An EPROM array, comprising:
    a plurality of EPROM cells disposed in rows and columns, each EPROM cell including:
    a semiconductor substrate, having source and drain regions;
    a floating gate, separated from the semiconductor substrate by a first dielectric layer, the floating gate including a semiconductive polysilicon layer electrically interconnected with a first conductive metal layer;
    a control gate, comprising a second conductive metal layer, capacitively coupled to the first metal layer via a second dielectric material disposed therebetween; and
    a resistor disposed in series between the drain region and an input voltage source for the EPROM cell, the resistor being configured to provide a breakdown current limit for the EPROM cell.

18. An EPROM array in accordance with claim 17, further comprising:
    a row control transistor associated with each row; and
    a column control transistor associated with each column.

19. An EPROM array in accordance with claim 17, wherein the resistor has a resistance of about 100 ohms.

20. An EPROM array, comprising:
a plurality of EPROM cells disposed in rows and columns, each EPROM cell including:
   a semiconductor substrate, having source and drain regions;
   a floating gate, separated from the semiconductor substrate by a first dielectric layer of substantially uniform thickness, the floating gate including a semiconductive polysilicon layer of substantially uniform thickness engaging the first dielectric layer and being electrically interconnected with a first conductive metal layer; and
   a control gate, comprising a second conductive metal layer, capacitively coupled to the first metal layer via a second dielectric material disposed therebetween.

21. An EPROM array in accordance with claim 20, wherein each EPROM cell is configured to accomodate a programming voltage of about 16± 1 volts.

22. An EPROM cell, comprising:
a control gate, comprising a first metal layer;
a second metal layer capacitively coupled to the first metal layer;
a polysilicon layer of substantially uniform thickness, electrically interconnected to the second metal layer, the polysilicon layer and second metal layer comprising a floating gate;
a doped semiconductor substrate, having source and drain regions; and
a first dielectric layer of substantially unifrom thickness, disposed between the semiconductor substrate and the polysilicon layer, such that an electrical charge associated with the floating gate will affect a level of current between the source and drain regions.

23. An EPROM cell in accordance with claim 22, wherein the top of the floating gate is coincident with the upper surface of the first metal layer, the bottom of the floating gate is coincident with the lower surface of the polysilicon layer, and the top of the floating gate is substantially parallel to the bottom of the floating gate.

24. An EPROM cell in accordance with claim 22, wherein the control gate is substantially planar.

25. An EPROM cell in accordance with claim 22, wherein the polysilicon layer is generally parallel to the second metal layer.

* * * * *

UNITED STATES PATENT AND TRADEMARK OFFICE
CERTIFICATE OF CORRECTION

PATENT NO. : 7,345,915 B2  Page 1 of 1
APPLICATION NO. : 11/263337
DATED : March 18, 2008
INVENTOR(S) : Trudy Benjamin It is certified that error appears in the above-identified patent and that said Letters Patent is hereby corrected as shown below:

On the Title page, in field (56), under "U.S. Patent Documents", in column 1, line 11, delete "5,931,335 A 8/1999 Cippitani" and insert -- 5,981,335 11/1999 Chi --, therefor.

In column 8, lines 22-23, in Claim 12, delete "semiconductor" and insert -- semiconductive --, therefor.

In column 9, line 19, in Claim 21, delete "accomodate" and insert -- accommodate --, therefor.

In column 10, line 7, in Claim 22, delete "unifrom" and insert -- uniform --, therefor.

Signed and Sealed this

Twenty-ninth Day of July, 2008

JON W. DUDAS
*Director of the United States Patent and Trademark Office*